(12) United States Patent
Lee et al.

(10) Patent No.: US 8,053,358 B2
(45) Date of Patent: Nov. 8, 2011

(54) METHODS OF FORMING INTEGRATED CIRCUIT DEVICES USING CONTACT HOLE SPACERS TO IMPROVE CONTACT ISOLATION

(75) Inventors: Doo-young Lee, Seoul (KR); Sang-sup Jeong, Gyeonggi-do (KR); Sung-gil Choi, Yongin-si (KR); Jong-chul Park, Gyeonggi-do (KR); Jin-young Kim, Gyeonggi-do (KR); Ki-jin Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/965,091

(22) Filed: Dec. 10, 2010

(65) Prior Publication Data

US 2011/0104889 A1  May 5, 2011

Related U.S. Application Data

(63) Continuation of application No. 12/575,682, filed on Oct. 8, 2009, now Pat. No. 7,875,551.

(51) Int. Cl.
*H01L 23/58* (2006.01)

(52) U.S. Cl. ............... 438/637; 438/638; 257/E21.577

(58) Field of Classification Search .............. 438/629, 438/637, 638, 639; 257/E21.577, E21.578
See application file for complete search history.

(56) References Cited

U.S. PATENT DOCUMENTS 6,501,141 B1 * 12/2002 Leu .............................. 257/413
2009/0179332 A1   7/2009 Ono

FOREIGN PATENT DOCUMENTS

| JP | 11-354499 | 12/1999 |
|---|---|---|
| JP | 2004-335526 | 11/2004 |
| KR | 1020060114431 A | 11/2006 |

* cited by examiner

*Primary Examiner* — Hoai V Pham
(74) *Attorney, Agent, or Firm* — Myers Bigel Sibley & Sajovec, P.A.

(57) ABSTRACT

Methods of forming integrated circuit devices include upper sidewall spacers in contact holes to provide enhanced electrical isolation to contact plugs therein while maintaining relatively low contact resistance. These methods include forming an interlayer insulating layer on a semiconductor substrate. The interlayer insulating layer includes at least a first electrically insulating layer of a first material on the semiconductor substrate and a second electrically insulating layer of a second material on the first electrically insulating layer. A contact hole is formed that extends through the interlayer insulating layer and exposes a primary surface of the semiconductor substrate. This contact hole may be formed by selectively etching the second electrically insulating layer and the first electrically insulating layer in sequence and at a faster etch rate of the first material relative to the second material. This sequential etching of the first material at a faster rate than the second material may yield a contact hole having a recessed sidewall.

3 Claims, 9 Drawing Sheets

METHODS OF FORMING INTEGRATED CIRCUIT DEVICES USING CONTACT HOLE SPACERS TO IMPROVE CONTACT ISOLATION

REFERENCE TO PRIORITY APPLICATIONS

This application is a continuation of U.S. patent application Ser. No. 12/575,682, filed Oct. 8, 2009, now U.S. Pat. No. 7,875,551, which claims priority to Korean Patent Application No. 10-2008-0110031, filed Nov. 6, 2008, the disclosures of which are hereby incorporated herein by reference.

FIELD OF THE INVENTION

The present invention relates to methods of manufacturing semiconductor devices and, more particularly, to methods of manufacturing semiconductor devices having highly integrated contact plugs therein.

BACKGROUND

Since the integration degree of semiconductor devices has increased, the size of semiconductor devices has been reduced. Accordingly, the size of contact holes connecting conduction wirings has been also reduced. One of the methods for overcoming the limitations of the photolithography process for forming contact holes is a method of forming a self-aligned contact hole using, for example, a nitride layer as an etching barrier layer.

In general, an interlayer insulating layer of a semiconductor device is formed of an oxide layer. As the aspect ratio of self-aligned contact holes is increased and the pitch thereof is reduced, a void can be generated when gap-filling the interlayer insulating layer. In order to gap-fill the interlayer insulating layer without any voids, an oxide layer doped with a dopant is used. As the pitch of contact holes is reduced, the amount of the dopant doped in the oxide layer is also gradually increased.

After forming self-aligned contact holes by etching the oxide layer highly doped with a dopant, a cleaning process is performed to remove by-products created in the etching. During the cleaning process, the loss of the insulating layer doped with the dopant is increased, thereby reducing the isolation margin between the contacts holes.

SUMMARY

Methods of forming integrated circuit devices according to embodiments of the present invention utilize upper sidewall spacers in contact holes to provide enhanced electrical isolation to contact plugs therein while maintaining relatively low contact resistance. According to some of these embodiments of the invention, a method of forming an integrated circuit device includes forming an interlayer insulating layer on a semiconductor substrate. The interlayer insulating layer includes at least a first electrically insulating layer of a first material on the semiconductor substrate and a second electrically insulating layer of a second material on the first electrically insulating layer. A contact hole is formed that extends through the interlayer insulating layer and exposes a primary surface of the semiconductor substrate. This contact hole may be formed by selectively etching the second electrically insulating layer and the first electrically insulating layer in sequence and at a faster etch rate of the first material relative to the second material. This sequential etching of the first material at a faster etch rate than the second material may yield a contact hole having a recessed sidewall. In particular, the sequential etching step may be performed so that a lower sidewall of the contact hole along the first electrically insulating layer is recessed relative to a sidewall of the contact hole along the second electrically insulating layer.

The contact hole within the first electrically insulating layer is then partially filled with an electrically insulating sacrificial layer. This partial filling of the contact hole within the first electrically insulating layer leaves upper portions of the sidewalls in the first electrically insulating layer exposed. A spacer layer is then conformally deposited on an upper surface of the sacrificial layer and on exposed portions of sidewalls of the first electrically insulating layer and on exposed portions of lower surface of the second electrically insulating layers within the contact hole. Thereafter, an anisotropic etching step is performed to selectively etch back the spacer layer for a sufficient duration to expose the sacrificial layer and define an electrically insulating spacer on an upper portion of the sidewall of the first electrically insulating layer, which is recessed relative to the sidewall of the second electrically insulating layer within the contact hole.

The sacrificial layer comprises a spin on hardmask (SOH) or a photoresist material and is then selectively removed to expose the semiconductor substrate and a lower portion of the sidewall of the first electrically insulating layer that is recessed relative to an inner sidewall of the spacer. The contact hole is then filled with an electrically conductive plug.

According to some aspects of these embodiments of the invention, the step of selectively removing the sacrificial layer includes selectively removing the sacrificial layer using an ashing technique. The interlayer insulating layer may also be formed using a first electrically insulating layer including a material selected from a group consisting of borosilicate glass (BSG), phosphosilicate glass (PSG) and borophosphosilicate glass (BPSG), and a second electrically insulating layer including tetraethylorthosilicate glass (TEOS). Moreover, the step of partially filling the contact hole may include heating the sacrificial layer to reflow the sacrificial layer within the contact hole.

Methods of forming integrated circuit devices according to additional embodiments of the invention include forming a plurality of conductive patterns on a semiconductor substrate and forming an interlayer insulating layer on the plurality of conductive patterns and on portions of the semiconductor substrate extending between the plurality of conductive patterns. The interlayer insulating layer includes a first electrically insulating layer of a first material on the plurality of conductive patterns and a second electrically insulating layer of a second material on the first electrically insulating layer. A contact hole is then formed that extends through the interlayer insulating layer. This contact hole, which exposes a sidewall of conductive patterns and a source/drain region in the semiconductor substrate, may be formed by selectively etching the first electrically insulating layer and the second electrically insulating layer in sequence and at a faster etch rate of the first material relative to the second material. The contact hole within the first electrically insulating layer is then partially filled with an electrically insulating sacrificial layer. Thereafter, a spacer layer is formed on an upper surface of the sacrificial layer and on exposed portions of sidewalls of the first electrically insulating layer and on exposed portions of a lower surface of the second electrically insulating layers within the contact hole. The spacer layer is then selectively etched back for a sufficient duration to expose the sacrificial layer and define a spacer on an upper portion of the sidewall of the first electrically insulating layer that is recessed relative to the sidewall of the second electrically insulating layer within the contact hole. The sacrificial layer is selectively removed to expose the source/drain region and a lower portion of the sidewall of the first electrically insulating layer that is recessed relative to an inner sidewall of the spacer. The contact hole is then filled with an electrically conductive plug that contacts the source/drain region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
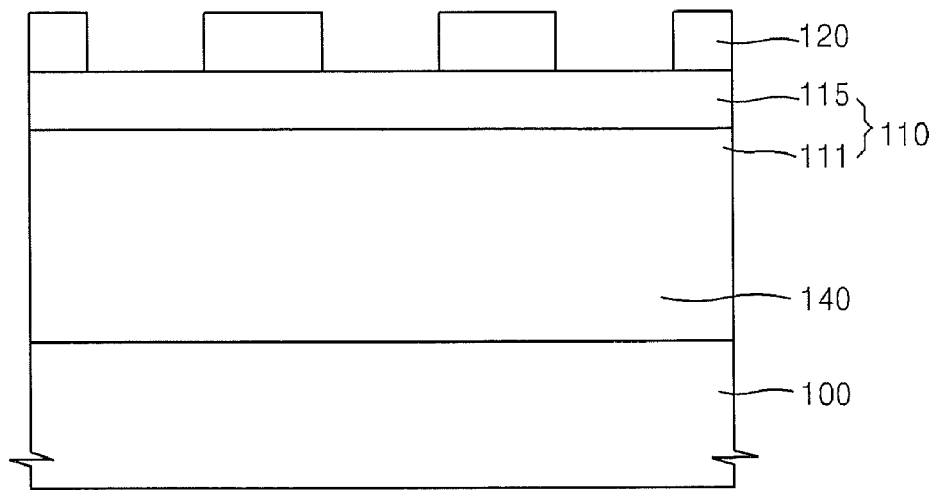
FIGS. 1A through 1G are cross-sectional views for explaining a method of manufacturing a semiconductor device according to an embodiment of the inventive concept.

The inventive concept will now be described more fully with reference to the accompanying drawings, in which exemplary embodiments of the inventive concept are shown. The inventive concept may, however, be embodied in many different forms, and should not be construed as being limited to the embodiments set forth herein; rather, these embodiments are provided so that this disclosure will be thorough and complete, and will fully convey the inventive concept to those skilled in the art. Like reference numerals denote like elements throughout the specification.

FIGS. 1A through 1G are cross-sectional views for explaining a method of manufacturing a semiconductor device according to an embodiment of the inventive concept. Referring to FIG. 1A, an interlayer insulating layer 110 is formed on a semiconductor substrate 100. A photosensitive layer 120 is formed on the interlayer insulating layer 110 such that portions of the interlayer insulating layer 110 where contact holes are to be formed are exposed. The interlayer insulating layer 110 may include a lower insulating layer 111 and an upper insulating layer 115.

The lower insulating layer 111 may include an insulating layer having excellent gap filling capability. The lower insulating layer 111 may include a layer selected from the group consisting of a borophospho-silicate glass (BPSG), borosilicate glass (BSG), and phosphor-silicate glass (PSG). The upper insulating layer 115 may include an oxide layer that is not doped with impurities, for example, a tetraethyl orthosilicate (TEOS) layer. The interlayer insulating layer 110 may include a single oxide layer doped with a dopant.

Figure 1B:
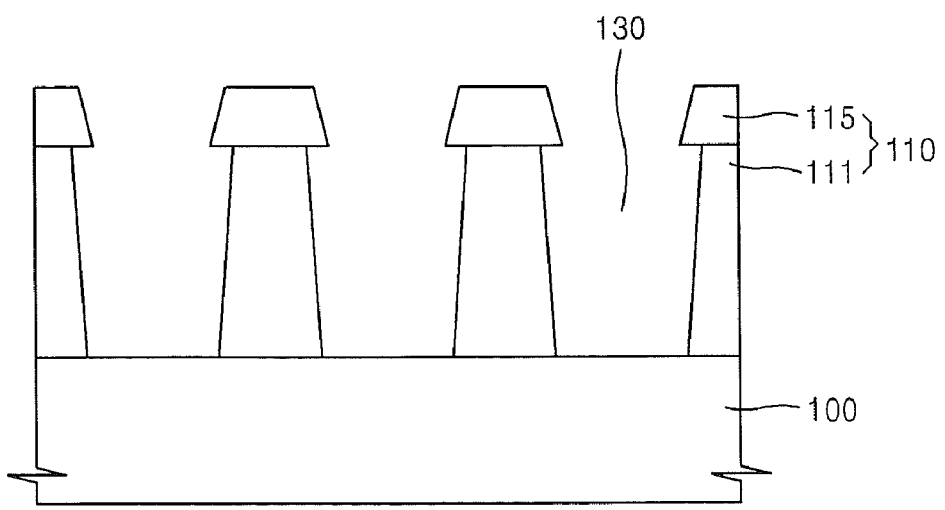

Referring to FIG. 1B, the photosensitive layer 120 is used as an etching mask to etch an exposed portion of the interlayer insulating layer 110 in order to form a contact hole 130. The contact hole 130 may be a self-aligned contact hole (SAC) formed using a self-alignment contact process. The contact hole 130 may have an inclined sidewall with respect to a surface of the semiconductor surface 100. The upper insulating layer 115 may be formed such that a lower surface of the upper insulating layer 115 is protruded from an upper surface of the lower insulating layer 111, which is recessed. Then, the photosensitive layer 120 is removed.

Figure 1C:
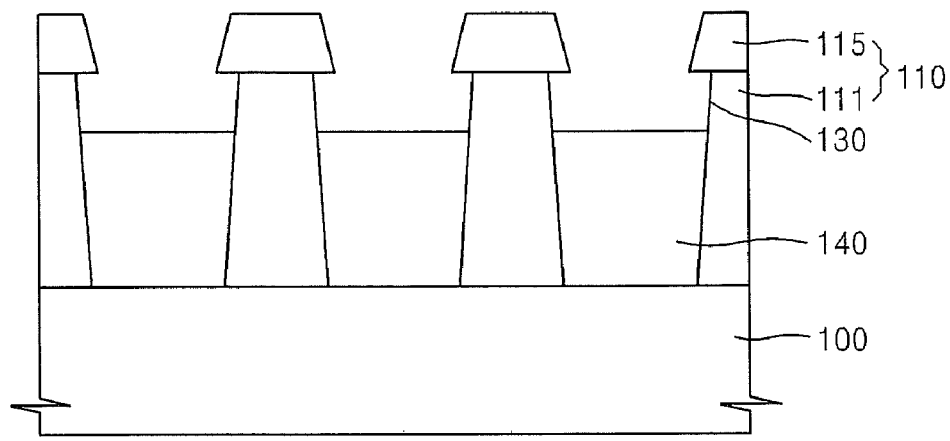

Referring to FIG. 1C, a sacrificial layer 140 is selectively formed such that only a portion of the contact hole 130 is buried with the sacrificial layer 140. The sacrificial layer 140 may be formed such that at least a portion of the sidewalls of the lower insulating layer 111 exposed by the contact hole 130 are exposed. The sacrificial layer 140 may include a reflowable material, for example, a section overhead (SOH) or a photoresist. The sacrificial layer 140 is reflowed through a heating treatment.

Figure 1D:
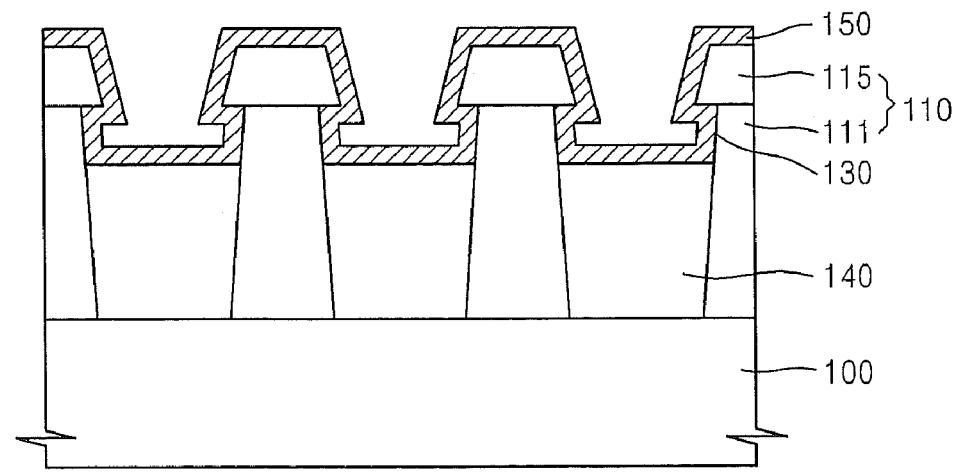

Referring to FIG. 1D, a spacer material 150 is deposited on the upper insulating layer 115, the sacrificial layer 140, and the at least exposed portion of the sidewall of the lower insulating layer 111. The spacer material 150 may include a material having an etching selectivity with respect to the lower insulating layer 111 of the interlayer insulating layer 110. The spacer material 150 may include a layer selected from the group consisting of a polysilicon layer, an oxide layer, and a nitride layer.

Figure 1E:
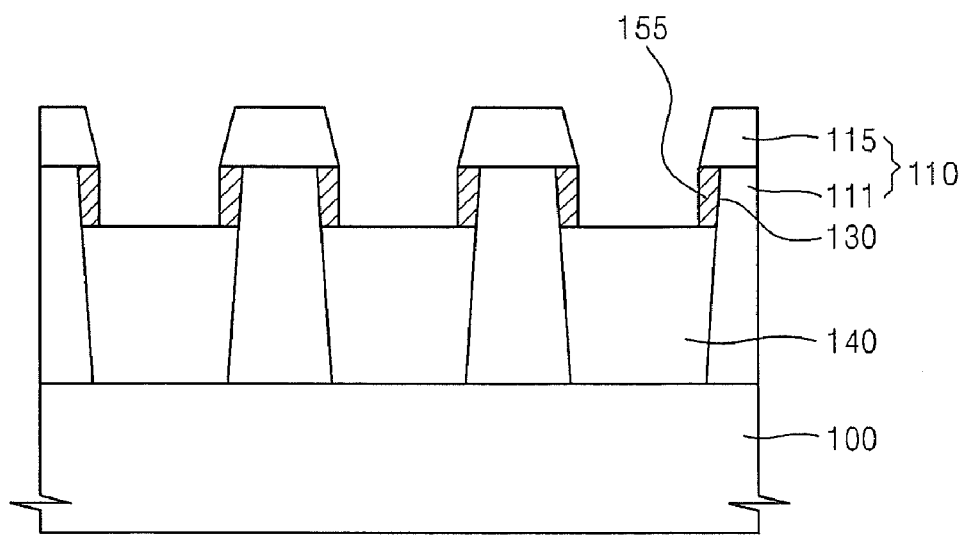

Referring to FIG. 1E, the spacer material 150 is anisotropically etched to form a spacer 155 in the contact hole 130. The spacer 155 may be formed on the exposed portion of the sidewall of the lower insulating layer 111. The spacer 155 may be formed on the lower surface of the upper insulating layer 115 and the sidewall of the lower insulating layer 111 as the contact hole 130 has the inclined sidewall.

Figure 1F:
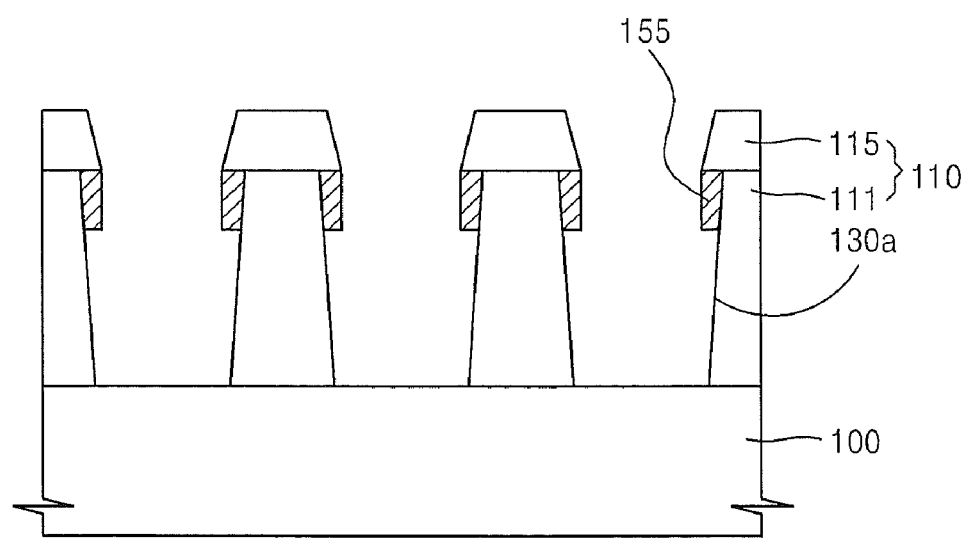

Referring to FIG. 1F, the sacrificial layer 140 is removed using an ashing process, or the like. Next, a cleaning process is performed. During the cleaning process, the spacer 155 functions as an etching barrier, thereby preventing etching loss of the lower insulating layer 111. Then, as the sacrificial layer 140 is removed, a contact hole 130a is formed in the interlayer insulating layer 110 and the spacer 155 is formed in an upper portion of the contact hole 130. A portion of the semiconductor substrate 100 is exposed via the contact hole 130a.

Figure 1G:
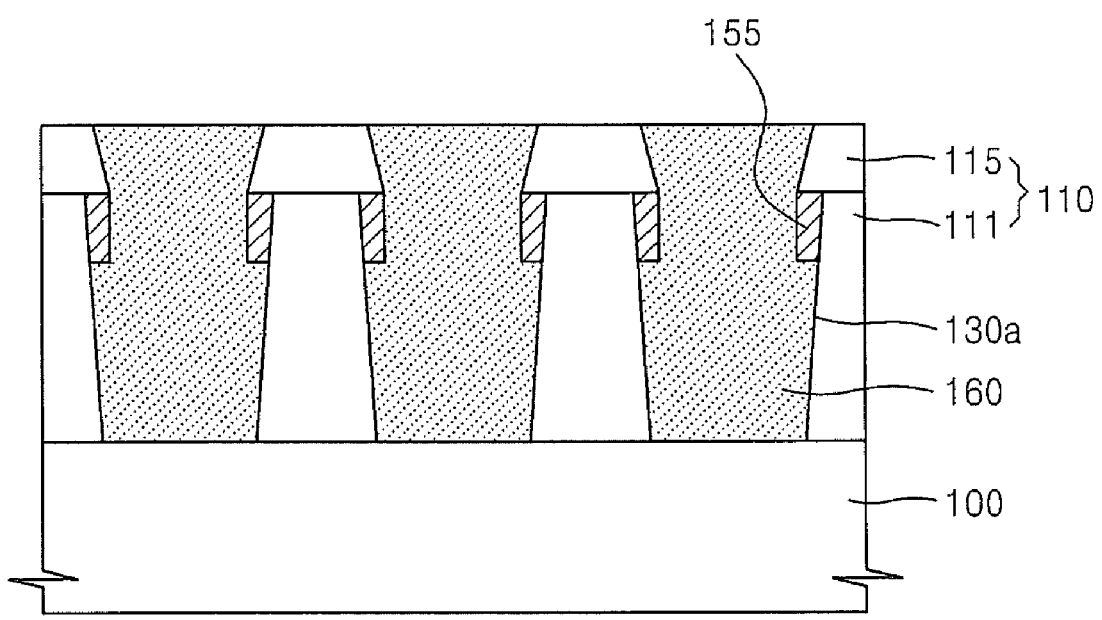

Referring to FIG. 1G, a contact plug material is deposited on the interlayer insulating layer 110 so as to completely fill the contact hole 130a, and the contact plug material is etched using a process such as an etchback process or a chemical mechanical polishing (CMP) process to form a contact plug 160 in the contact hole 130a. The contact plug 160 may include a poly plug.

Figure 2A:
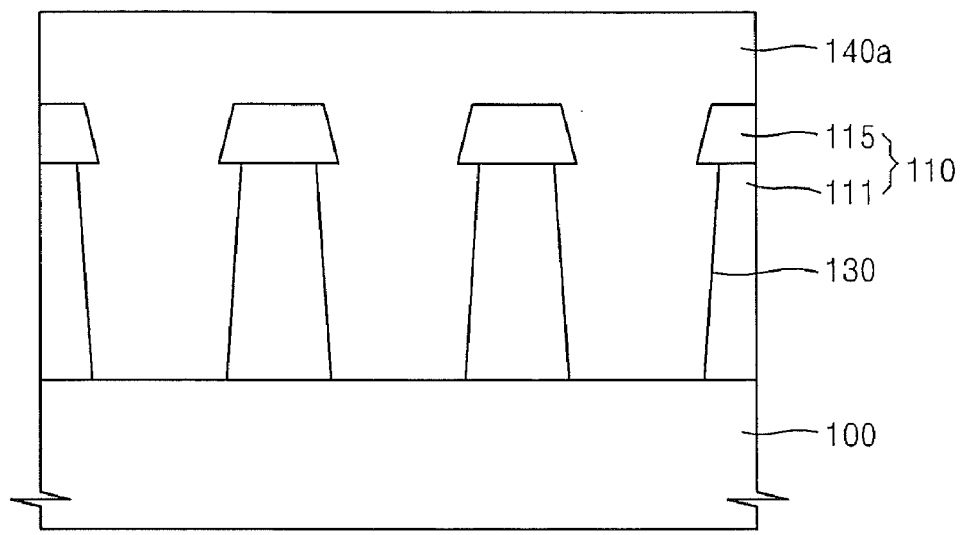
FIGS. 2A and 2B are cross-sectional views for explaining a method of manufacturing a semiconductor device according to another embodiment.
Figure 2B:
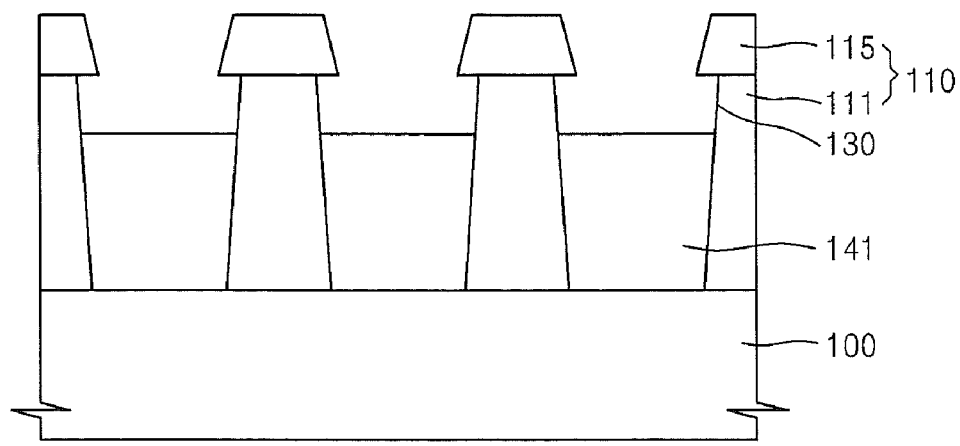

FIGS. 2A and 2B are cross-sectional views for illustrating a method of manufacturing a semiconductor device according to another embodiment. The method of manufacturing a semiconductor device of the current embodiment is the same as in the previous embodiment except for forming a sacrificial layer, and thus only the forming of a sacrificial layer will be described with reference to FIGS. 2A and 2B.

An interlayer insulating layer 110 is etched to form a contact hole 130 that exposes a portion of a semiconductor substrate 100 and a sidewall of the interlayer insulating layer 110. A sacrificial layer 140a is formed on the interlayer insulating layer 110 so that the contact hole 130 is completely filled. The sacrificial layer 140a may include a material that can be reflowed, such as a SOH or a photoresist. The sacrificial layer 140a is etched using an etchback process, or the like. Accordingly, the remnant sacrificial layer 141 is filled in the contact hole 130 such that at least an upper portion of a sidewall of a lower insulating layer 111 of the interlayer insulating layer 110 is exposed.

Figure 3A:
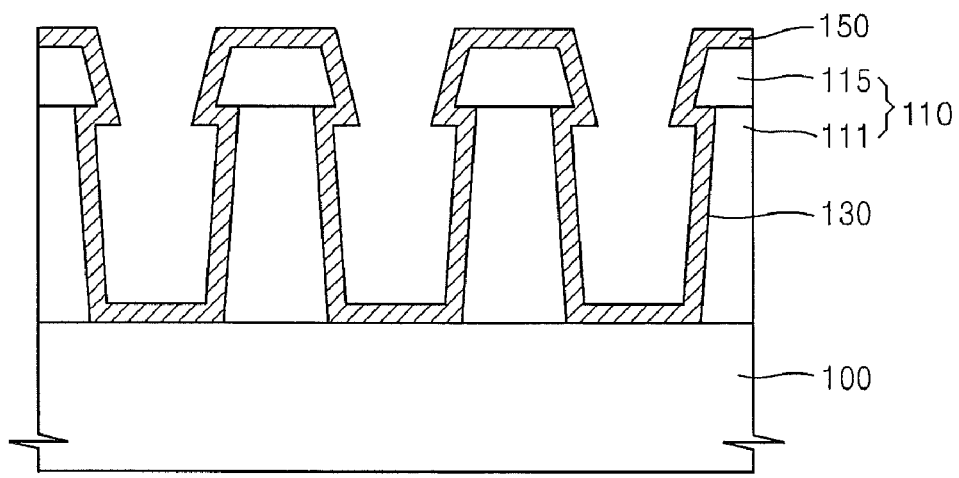
FIGS. 3A and 3B are cross-sectional views for explaining a method of manufacturing a semiconductor device according to another embodiment.
Figure 3B:
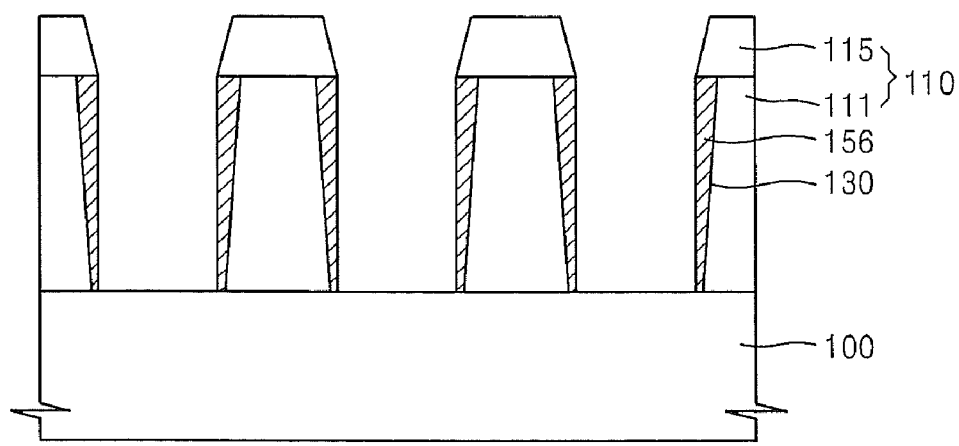

FIGS. 3A and 3B are cross-sectional views for explaining a method of manufacturing a semiconductor device according to another embodiment. The method of manufacturing a semiconductor device of the current embodiment is the same as in the embodiment with reference to FIGS. 1A through 1G except for forming of a spacer layer, and thus only the forming of a spacer layer will be described with reference to FIGS. 3A and 3B.

An interlayer insulating layer 110 is etched to form a contact hole 130 that exposes a portion of a semiconductor substrate 100 and a sidewall of the interlayer insulating layer 110. A spacer material 150 is formed on the interlayer insulating layer 110 and the exposed portion of the semiconductor substrate 100. The spacer material 150 is anisotropically etched to form a spacer 156 on the sidewall of the interlayer insulating layer 110 in the contact hole 130.

The spacer 156 may extend to a bottom of the contact hole 130 to contact the exposed portion of the semiconductor substrate 100. In order to avoid a decrease in a contact resistance between a contact plug (160 in FIG. 1G) to be formed subsequently and the semiconductor substrate 100, the spacer 156 may include a conductive layer such as a polysilicon layer.

Figure 4A:
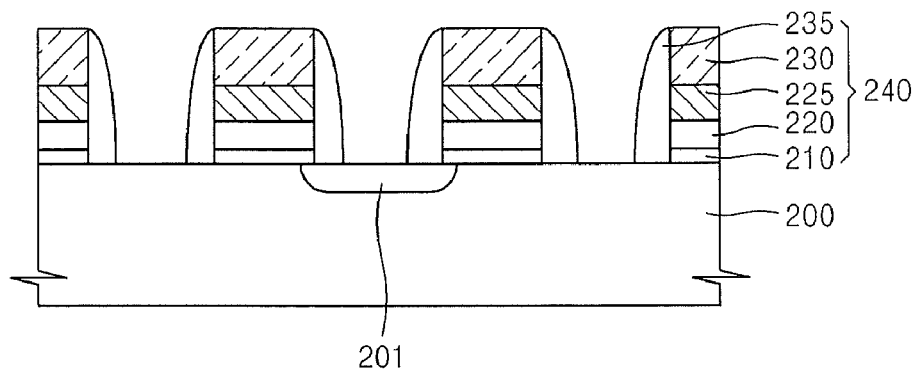
FIGS. 4A through 4E are cross-sectional views for explaining a method of manufacturing a semiconductor device according to another embodiment.

FIGS. 4A through 4E are cross-sectional views for explaining a method of manufacturing a semiconductor device according to another embodiment. Referring to FIG. 4A, a plurality of gate structures 240 are arranged on a semiconductor substrate 200 having at least one source/drain region 201 therein. Each of the gate structures 240 may include a gate insulating layer 210, a polysilicon layer 220 and a tungsten layer 225, which are gate electrode materials, a gate capping layer 230, and a gate spacer 235 that is formed on sidewalls of the gate insulating layer 210, the gate capping layer 230, and the polysilicon layer 220 and the tungsten layer 225. The at least one source/drain region 201 may be formed in the substrate 200, as illustrated, by implanting source/drain dopants into the substrate 200 using at least one gate structure 240 as an implant mask.

Figure 4B:
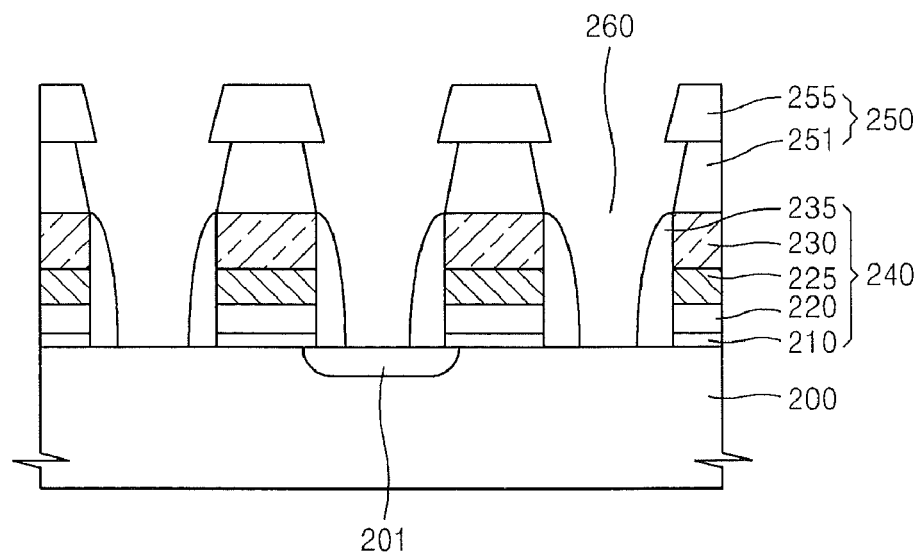

Referring to FIG. 4B, an interlayer insulating layer 250 is formed on the semiconductor substrate 200 including the gate structures 240. The interlayer insulating layer 250 may include a lower insulating layer 251 that is buried in the gate structures 240 and an upper insulating layer 255 that is disposed on the lower insulating layer 251. The lower insulating layer 251 may include an oxide layer doped with a dopant, for example, one of BSG, PSG, and BPSG. The upper insulating layer 255 may include an oxide layer that is not doped with a dopant, for example, TEOS.

A photosensitive layer (not shown) is formed on the interlayer insulating layer 250 such that portions of the interlayer insulating layer 250 between the gate structures 240 are exposed. The interlayer insulating layer 250 is etched using the photosensitive layer as an etching mask, and thus a plurality of self-aligned contact holes 260 that expose portions of the semiconductor substrate 200 and the gate spacers 235 and the sidewalls of the interlayer insulating layer 250 are formed. Then the photosensitive layer is removed.

Figure 4C:
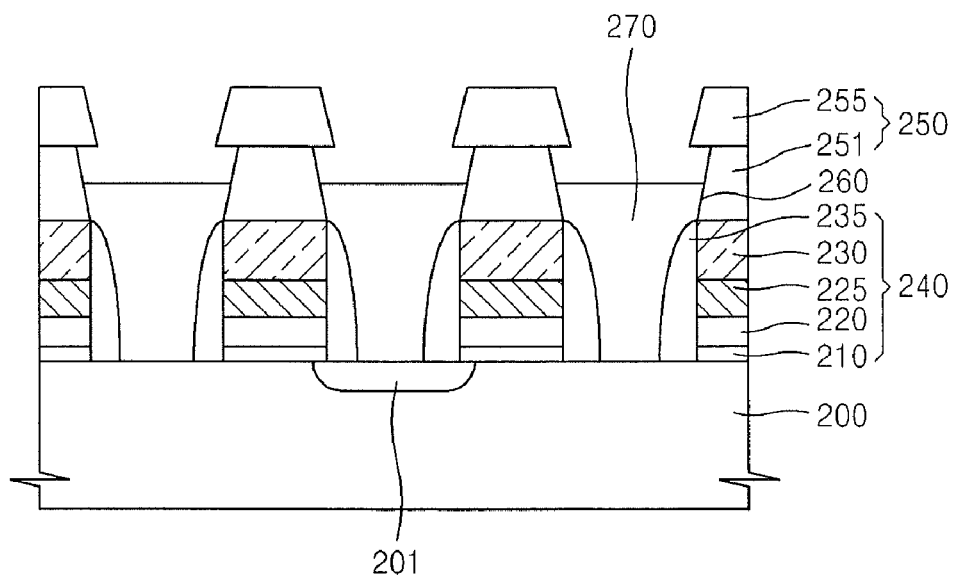

Referring to FIG. 4C, a sacrificial layer 270 is formed in each of the self-aligned contact holes 260 such that at least a portion of the lower insulating layer 251 is exposed. The sacrificial layer 270 is formed to be filled with only a portion of each of the self-aligned contact holes 260 and then flown or formed to be completely filled with the self-aligned contact holes 260 and then etched.

The sacrificial layer 270 may be formed to cover at least the gate structures 240. The sacrificial layer 270 may include a material having an etching selectivity from the oxide layer of the interlayer insulating layer 250 and nitride layers of the gate capping layer 230 and the gate spacer 235. The sacrificial layer 270 may include SOH or a photoresist layer that can be reflowed.

Figure 4D:
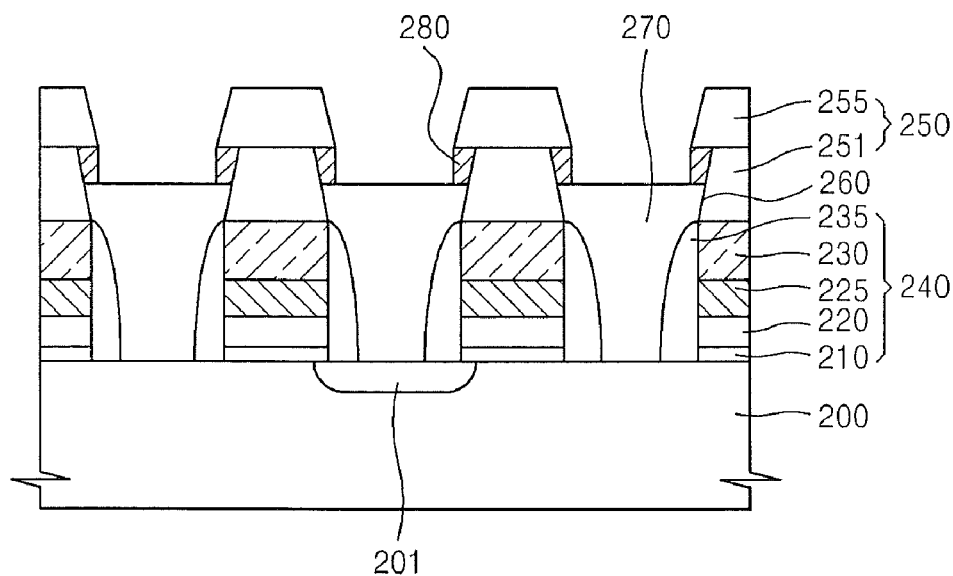

Referring to FIG. 4D, a spacer material is deposited over the whole semiconductor substrate 200, and then anisotropically etched to form a spacer 280 in the exposed sidewalls of the lower insulating layer 251. When forming the spacer 280, the gate structures 240 are buried by the sacrificial layer 270 and the gate spacer 235 is protected from being etched, thereby providing a sufficient isolation margin.

When the spacer 280 is to be formed to contact the exposed portions of the semiconductor substrate 200, as in FIGS. 3A and 3B, the spacer material may be etched under an etching condition with sufficient etching selectivity to the nitride layers in order to prevent etching damage of the gate spacer 235 and the gate capping layer 230.

Figure 4E:
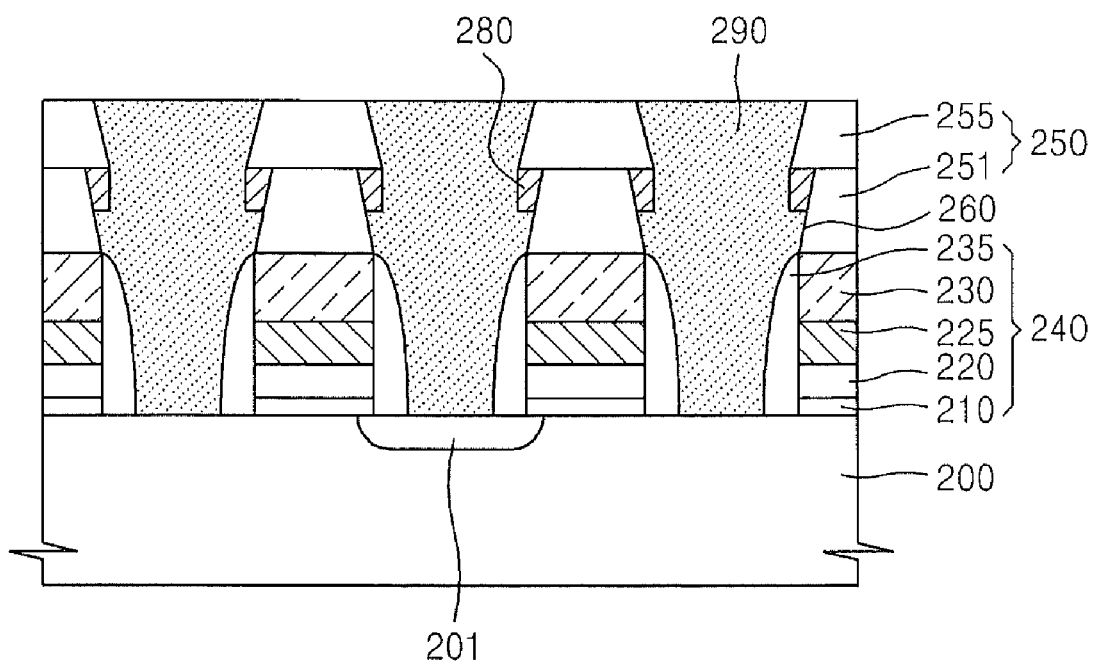

Referring to FIG. 4E, the sacrificial layer 270 is removed using a process such as an ashing process, and then a cleaning process is performed. Then, contact plugs 290 are formed in the self-aligned contact holes 260 in which the spacers 280 are arranged.

The method described with reference to FIGS. 4A through 4E may also be applied to forming a contact hole for a storage node between bit lines (not shown) by using a self-alignment method.

While the inventive concept has been particularly shown and described with reference to exemplary embodiments thereof, it will be understood that various changes in form and details may be made therein without departing from the spirit and scope of the following claims.

What is claimed is:

1. A method of forming an integrated circuit device, comprising:
    forming an interlayer insulating layer on a semiconductor substrate, said interlayer insulating layer comprising a first electrically insulating layer of a first material on the semiconductor substrate and a second electrically insulating layer of a second material on the first electrically insulating layer;
    forming a contact hole that extends through the interlayer insulating layer and exposes the semiconductor substrate, by selectively etching the second electrically insulating layer and the first electrically insulating layer in sequence and at a faster etch rate of the first material relative to the second material;
    forming a polysilicon layer on sidewalls of the first and second electrically insulating layers within the contact hole and on the exposed portion of the semiconductor substrate within the contact hole;
    etching the polysilicon layer to form a spacer that is arranged on the exposed portions of the sidewalls of the first electrically insulating layer and exposed portions of a lower surface of the second insulating layer; and then filling the contact hole with an electrically conductive plug.

2. The method of claim 1, wherein the first electrically insulating layer is formed on the semiconductor substrate and doped with a dopant; and the second electrically insulating layer is formed on the first electrically insulating layer and not doped with a dopant.

3. The method of claim 1, wherein the first electrically insulating layer comprises a material selected from a group consisting of borosilicate glass (BSG), phosphosilicate glass (PSG) and borophosphosilicate glass (BPSG); and wherein the second electrically insulating layer comprises tetraethylorthosilicate glass (TEOS).

* * * * *